(12) United States Patent
Accard et al.

(10) Patent No.: US 7,567,604 B2
(45) Date of Patent: Jul. 28, 2009

(54) OPTICAL DEVICE WITH INTEGRATED SEMI-CONDUCTOR LASER SOURCE AND INTEGRATED OPTICAL ISOLATOR

(75) Inventors: Alain Accard, Marcoussis (FR); Béatrice Dagens, Antony (FR)

(73) Assignee: Alcatel (FR)

( * ) Notice: Subject to any disclaimer, the term of this patent is extended or adjusted under 35 U.S.C. 154(b) by 0 days.

(21) Appl. No.: 11/483,182

(22) Filed: Jul. 10, 2006

(65) Prior Publication Data
US 2007/0064753 A1      Mar. 22, 2007

(30) Foreign Application Priority Data
Jul. 8, 2005      (FR) .................................. 05 07320

(51) Int. Cl.
*H01S 5/00*      (2006.01)
(52) U.S. Cl. ..................... 372/46.01; 372/50.1; 359/248
(58) Field of Classification Search ............. 372/46.01, 372/50.1; 359/248
See application file for complete search history.

(56) References Cited

U.S. PATENT DOCUMENTS

| 2004/0179256 A1 | 9/2004 | Hammer |
| 2005/0146779 A1 * | 7/2005 | Okhotnikov et al. ........ 359/321 |

OTHER PUBLICATIONS

Shimizu et al First Demonstration of TE Mode Nonreciprocal Propagation in an InGaAsP/InP Active Waveguide for an Integratable Optical Isolator, Japanese Journal of Applied Physics, vol. 43, No. 12A, 2004, pp. L1561-L 1563.*

Shimizu et al "Design of semiconductor-waveguide-type optical isolators using the nonreciprocal Iss/gain in the magneto-optical waveguides having MnAs nanoclusters" Applied Physics Letters, Department of Electronic Engineering, The University of Tokyo, vol. 81, No. 27 Dec. 30, 2002, p. 5246-5248.*

(Continued)

*Primary Examiner*—Minsun Harvey
*Assistant Examiner*—Yuanda Zhang
(74) *Attorney, Agent, or Firm*—Lowe Hauptman; Ham & Berner, LLP

(57) ABSTRACT

The field of the invention is that of optical devices comprising an integrated semi-conductor laser and an integrated optical isolator. These devices are used mainly in the field of digital telecommunications. More particularly, the invention applies to so-called absorption isolators whose complex index is non-reciprocal and depends on the direction of propagation of the light. Generally, integrated optical isolators of this type fulfill two functions. On the one hand, they comprise a magneto-optical layer ensuring the non-reciprocal effect and on the other hand an active zone ensuring the amplification of the laser beam, the injection of the charge carriers into the active zone being ensured by an electrical contact layer. The invention proposes, so as to limit the disturbing effects of the contact layer on the propagation of the laser beam, that the contact layer be eliminated above the active zone and that the injection of the charge carriers be ensured via the lateral faces and the edges of the upper face of the active zone.

13 Claims, 4 Drawing Sheets

OTHER PUBLICATIONS

Zayets et al "Isolation effect in ferromagnetic-metal/semiconductor hybrid optical waveguide" Applied Physics Letter, Nanoelectronics Research Institute, National Institute of Advanced Industrial Science, 86, 261105 2005.*

Vanwolleghem et al "Experimental demonstration of nonreciprocal amplified spontaneous emission in a CoFe clad semiconductor optical amplifier for us as an integrated optical isolator" Applied Physics Letters vol. 85, No. 18 Department of Information Technology, Ghent Univerity, Nov. 1, 2004.*

Abstract EP 1 039 330 A Sep. 27, 200 The University of Tokyo. Takenaka M et al "Proposal of a Novel Semiconductor Optical Waveguide Isolator" International Conference on Indium Phosphide And Related Materials, May 16, 1999 pp. 289-292.

Abstract EP 0 397 089A Nov. 14, 1990 Cannon Kabushiki Kaisha. Sakurai K et al: "Monolithic integration of laser diode and magneto-optic waveguide" Lasers and Electro-Optics Europe, 2003. Cleo/Europe. 2003 Conference on Munich, Germany Jun. 22-27, 2003, Piscataway, NJ, Jun. 22, 2003.

* cited by examiner

OPTICAL DEVICE WITH INTEGRATED SEMI-CONDUCTOR LASER SOURCE AND INTEGRATED OPTICAL ISOLATOR

BACKGROUND OF THE INVENTION

1. Field of the Invention

The field of the invention is that of optical devices comprising an integrated semi-conductor laser emission source and an integrated optical isolator. These devices are used mainly in the field of high-speed digital telecommunications.

2. Description of the Prior Art

It is known that a laser source can be rendered unstable by a stray optical beam emanating from the initial emission beam and reflected by an optical surface external to the cavity of the laser. Subsequently in the text, a light emission source comprising an optical amplifier of laser type will either be called a laser source or laser. To decrease this phenomenon, an optical isolator is disposed at the exit of the laser. Its function is to allow through the light emanating from the laser and to eliminate any stray light coming in the opposite direction.

Basically, an optical isolator implements a non-reciprocal optical effect making it possible to ensure this function. The best known is the Faraday effect. Subjected to an external magnetic field, certain so-called magneto-optical materials rotate the plane of polarization of the light in a different direction according to the direction of propagation of the light. Thus, by placing this type of material between appropriately disposed polarizers, it is possible to transmit the light propagating in a first direction and to block it in the opposite direction. These devices are rather unsuitable for optical devices comprising semi-conductor lasers insofar as they require a certain number of components that are difficult to integrate into devices whose dimensions are of the order of a millimeter.

Finally, it is possible to use optical isolators with non-reciprocal absorption. It is known that the optical index is complex. It comprises a real part and an imaginary part which is proportional to the absorption of the material. But, in the presence of a magnetic field, the optical index of certain materials of ferromagnetic type depends on the direction of propagation of the light. FIG. 1 presents the variations of the real and imaginary parts of the optical index of the optical mode termed transverse magnetic TM of this type of material as a function of the direction of propagation of the light. In the absence of a magnetic field, the optical index in the material 10 equals n. In the presence of a magnetic field symbolized by a black arrow, according to the direction of propagation of the light symbolized by a straight barred arrow, the index n becomes n↑ in a first direction of propagation and n↓ in the opposite direction. The difference between the two imaginary parts I.P. of the indices n↑ and n↓ gives the isolation ratio I.R. Consequently, according to its direction of propagation, a light beam will be more or less absorbed by this type of material.

The latter isolators are very suitable for integration with optical devices comprising a semi-conductor laser source. In this case, they are generally integrated with an amplifying structure of SOA type, the acronym signifying Semiconductor Optical Amplifier. Thus, the optical amplification provided by the SOA compensates, in a first direction of propagation, for the weaker absorption of the material. In the opposite direction of propagation, the absorption remains predominant and attenuates the light beam so as to avoid returns.

FIGS. 2, 3 and 4 represent a device of this type. FIG. 2 is a longitudinal sectional view and FIGS. 3 and 4 represent transverse sectional views. The structure essentially comprises two parts which are on the one hand a semi-conductor laser 10 and on the other hand an absorption optical isolator 20, the whole assembly lying on a common substrate 1.

The semi-conductor laser 10 is a so-called buried stripe structure also called a BRS structure, the acronym standing for Buried Ridge Stripe. The sectional diagram of such a structure is represented in FIG. 3. It comprises essentially:

- The common substrate 1 made of n-doped semi-conductor material. This first substrate is generally made of InP;
- An active part 2 formed by a stripe of rectangular cross section, the lower face of this active part lying on the first substrate 1. The active part has an optical index greater than that of the layers which surround it. It is of small section, of the order of a micron or of a few microns, and is generally made of GaInAsP or of GaInAlAs or of GaInNAs;
- A layer 3 made of p-doped semi-conductor material. This layer is also made of InP and it completely covers the lateral faces and the upper face of the active part 2. Its thickness is a few microns, typically 2 to 3;
- An electrical contact layer not represented in the figures disposed under the first substrate 1 and an upper electrical contact layer 11 disposed on the second substrate 3. These layers are generally made of InP/InGaAs. The electrodes are disposed on these contact layers. They convey the current necessary for the operation of the laser. Generally, the electrodes are made of gold platinum alloy.
- An implantation of protons is generally carried out in the p-doped layer, on either side of the active zone, to improve the electrical confinement. This implantation is represented by + symbols in the various figures.

This configuration makes it possible to ensure, at one and the same time:

- Confinement of the carriers injected into the stripe if the difference in forbidden bandwidth between the material of the first substrate and that of the second substrate is sufficient;
- Bidirectional guidance of the light if the difference in optical index between the material of the first substrate and that of the second substrate is also sufficient.

These lasers generally emit in the near infra-red at wavelengths neighbouring 1.3 microns or 1.5 microns. It is possible to append additional layers so as to carry out other functions. In particular, by adding an optical grating on the active layer, it is possible to produce a so-called distributed feedback DFB laser.

The optical isolator 20 is also a so-called buried stripe structure. The sectional diagram of such a structure is represented in FIG. 4. It comprises essentially and successively:

- The substrate 1 made of semi-conductor material made of n-doped InP common with that of the laser;
- An active part 2 also common with that of the laser;
- A layer 3 made of p-doped semi-conductor material. This layer also common with that of the laser is however, in the isolator part, of much smaller thickness so that the magnetic field is closest to the active layer. Its thickness does not exceed a few tenths of a micron.
- An electrical contact layer not represented in the figures disposed under the first substrate 1 and an upper electrical contact layer 21 disposed on the second substrate 3. The electrodes are disposed on these contact layers. The electrodes convey the current necessary for the amplification of the laser radiation.
- A ferromagnetic material layer 4 which can, for example, be made of Iron-Cobalt alloy. The magnetization of the material is symbolized by an arrow in FIG. 4 and by circles comprising a central cross in FIG. 2. This layer ensures at one and the same time magnetization of the active layer and electrical contact.

The implantation of protons in the layers 1 is symbolized by the symbol +.

The optical beam emitted by the semi-conductor laser propagates through the active layer common to the laser and to the isolator and the electrical contact layer. It is represented by straight barred arrows in FIG. 2 and by a series of faint-line concentric ellipses in FIGS. 3 and 4.

This configuration makes it possible to ensure at one and the same time the amplification of the light beam emanating from the semi-conductor laser and the absorption of the stray light coming in the opposite direction to the direction of propagation as indicated by the straight barred arrows of FIG. 2. The lengths of the arrows are representative of the amplitudes of the optical beams. With this type of configuration, it is possible to ensure an isolation ratio of greater than 25 dB with an optical isolator length of the order of 1 to 2 millimeters.

However, this type of configuration exhibits several major drawbacks. The electrical contact layer being very near to the active zone, it disturbs the propagation of the optical mode and causes significant optical losses. The structure of the electrical contacts not being optimized, significant electrical losses can occur, causing local heating. Finally, the small thickness of the substrate 3 necessary for the operation of the isolator poses technological production problems that are tricky to control.

To solve these difficulties it is of course possible to change the arrangement of the structure. In this case, the possibility of integrating into one single component at one and the same time the BRS laser and the optical isolator is lost. Moreover, this type of structure has lower performance.

SUMMARY OF THE INVENTION

The object of the invention is an optical isolator which, while preserving the BRS structure which allows the integration of a laser-isolator assembly does not exhibit the above drawbacks.

More precisely, the invention is aimed at an opto-electronic device comprising at least one amplifying structure of SOA type which comprises an optical isolator, the said structure comprising at least and successively:
 a substrate made of n-doped semi-conductor material;
 a stripe-shaped buried active zone comprising a lower face in contact with the substrate, an upper face and two lateral faces;
 a p-doped vertical confinement layer;
 an electrical contact layer and;
 a magneto-optical material layer,
 characterized in that at least the upper part of the structure, situated above the upper face of the active zone is devoid of contact layer in a central zone of dimensions at least equal to those of the said active zone.

It follows from this that the injection of the current into the active zone coming from the contact layer takes place mainly via the lateral faces or the lateral edges of the upper face of the active zone.

For each particular structure case, optimal values of the dimensions of the central zone can obviously be determined by simulations and experimentally.

Advantageously, the contact layer comprises at least two main parts surrounding this central zone devoid of contact layer, situated above the upper face of the active zone, the width of the said central zone being equal to about 1.5 times the width of the active zone.

Advantageously, a conducting layer is disposed above the magneto-optical material layer.

Advantageously, the device furthermore comprises a section comprising an emission source with semi-conductor laser with buried stripe of BRS type, the said section comprising at least one substrate, an active layer and a vertical confinement layer that are common to those of the amplifying structure, in such a way that the optical isolator ensures the isolation of the said laser. The laser can be of so-called distributed feedback DFB type and then comprises an optical grating disposed on or in proximity to the active layer.

Advantageously, the material of the substrate and of the confinement layer is InP, the active zone comprises at least one so-called MQW multiple quantum well structure, the material of the magneto-optical layer is made of Fe/Co, the material of the contact layer is Pt/InGaAs and the material of the conducting layer is gold.

Advantageously, the thickness of the confinement layer situated above the active zone in the zone of the optical isolator equals about 0.3 microns.

The invention also relates to a method of production of an opto-electronic device comprising at least one amplifying structure of SOA type comprising an optical isolator according to the invention, characterized in that the method of production comprises at least the following two steps which are:
 Step 1: production of the contact layer on the part of the structure corresponding to the optical isolator;
 Step 2: removal of the contact layer in the zone of the structure situated above the upper face of the active zone, this step of the method is carried out by chemical etching or by RIE, the acronym signifying Reactive Ion Etching.

BRIEF DESCRIPTION OF THE DRAWINGS

The invention will be better understood and other advantages will appear on reading the non-limiting description which follows and by virtue of the appended figures among which.

MORE DETAILED DESCRIPTION

Figure 1:
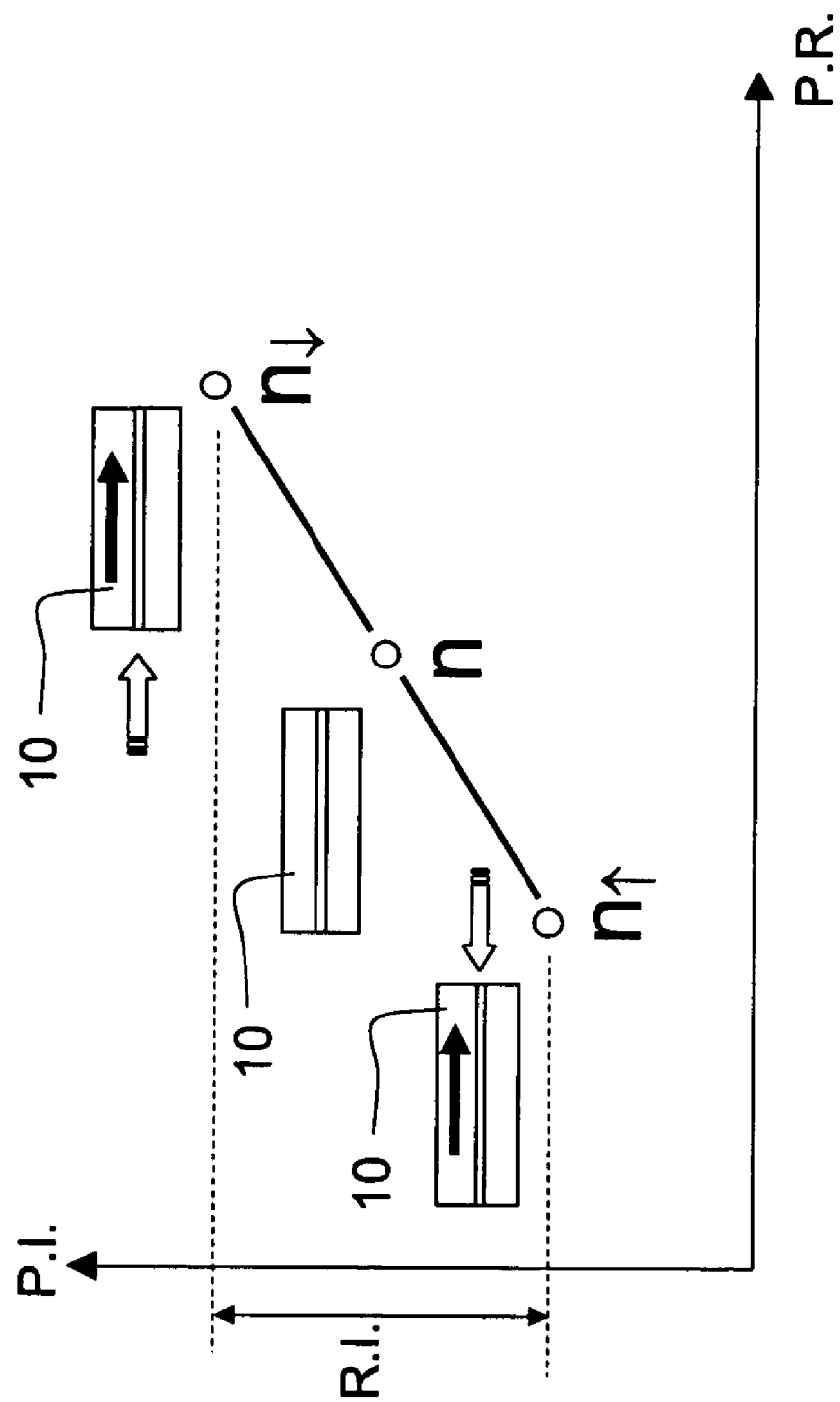
FIG. 1 represents the variations of the optical index of a magneto-optical material as a function of the direction of propagation of the light.
Figure 2:
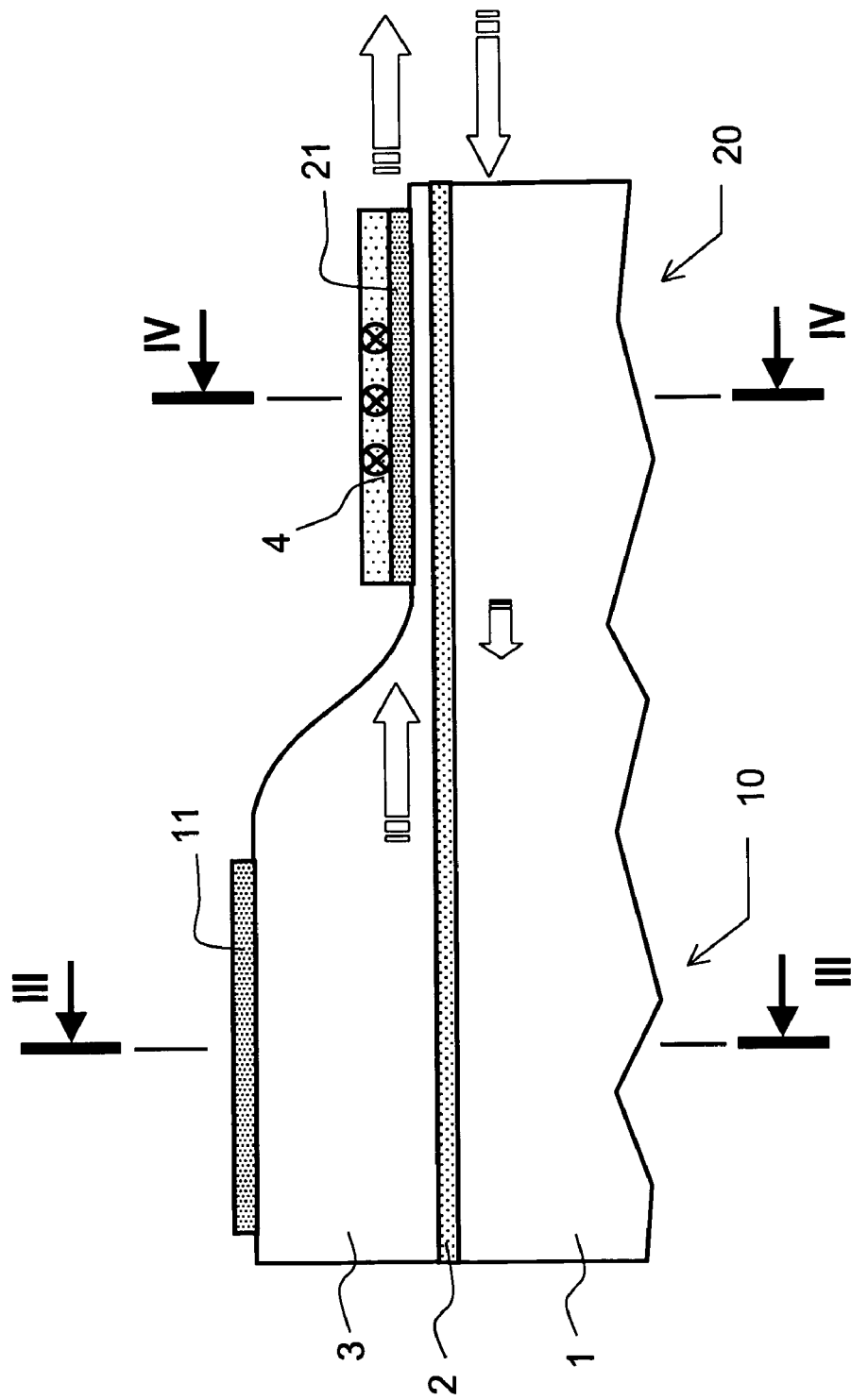
FIG. 2 represents a longitudinal sectional view of an opto-electronic device comprising an isolator according to the prior art.
Figure 4:
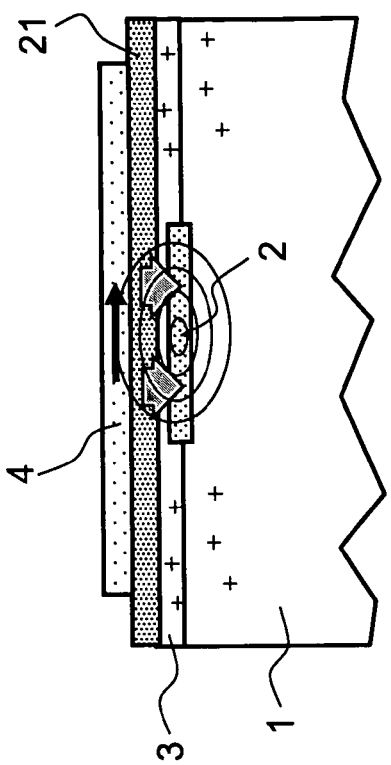
FIG. 4 represents a second transverse sectional view of an opto-electronic device comprising an isolator according to the prior art.
Figure 3:
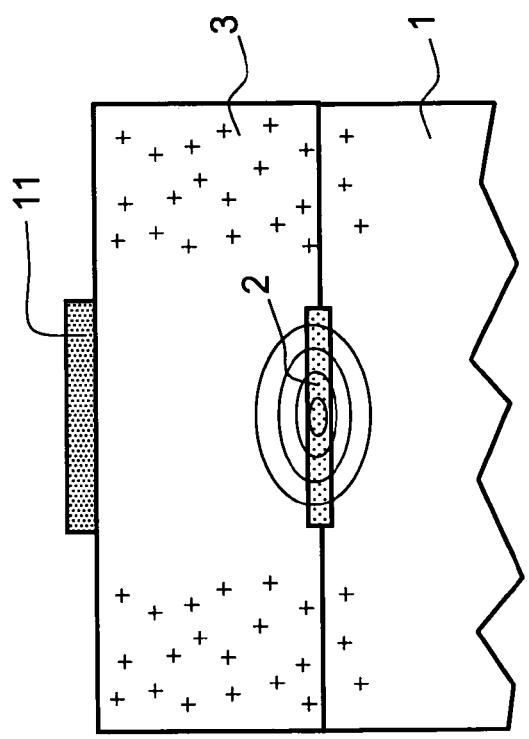
FIG. 3 represents a first transverse sectional view of an opto-electronic device comprising an isolator according to the prior art.

As has been seen, one of the major drawbacks of structures with optical isolator according to the prior art is that the electrical contact layer is very near to the active zone so that the magneto-optical material is closest to the said zone. This configuration is generally adopted because it makes it possible to easily inject the current into the active zone as indicated by the vertical solid arrows of FIG. 4 representing the current injection.

The core of the invention is to decouple the current injection means making it possible to ensure the amplification of the SOA, from the magneto-optical means making it possible to ensure the non-reciprocal effect of the isolator. To this end, the electrical contact layer is disposed so that the injection of the charge carriers takes place via the lateral faces and the edges of the upper face of the active layer. Amplification and isolation are thus ensured at one and the same time without having the drawbacks of the devices according to the prior art. Trials performed by the applicant have shown that an injection of current obliquely via the lateral faces exhibits performance similar to that of conventional injection perpendicularly to the upper face of the active zone.

Figure 5:
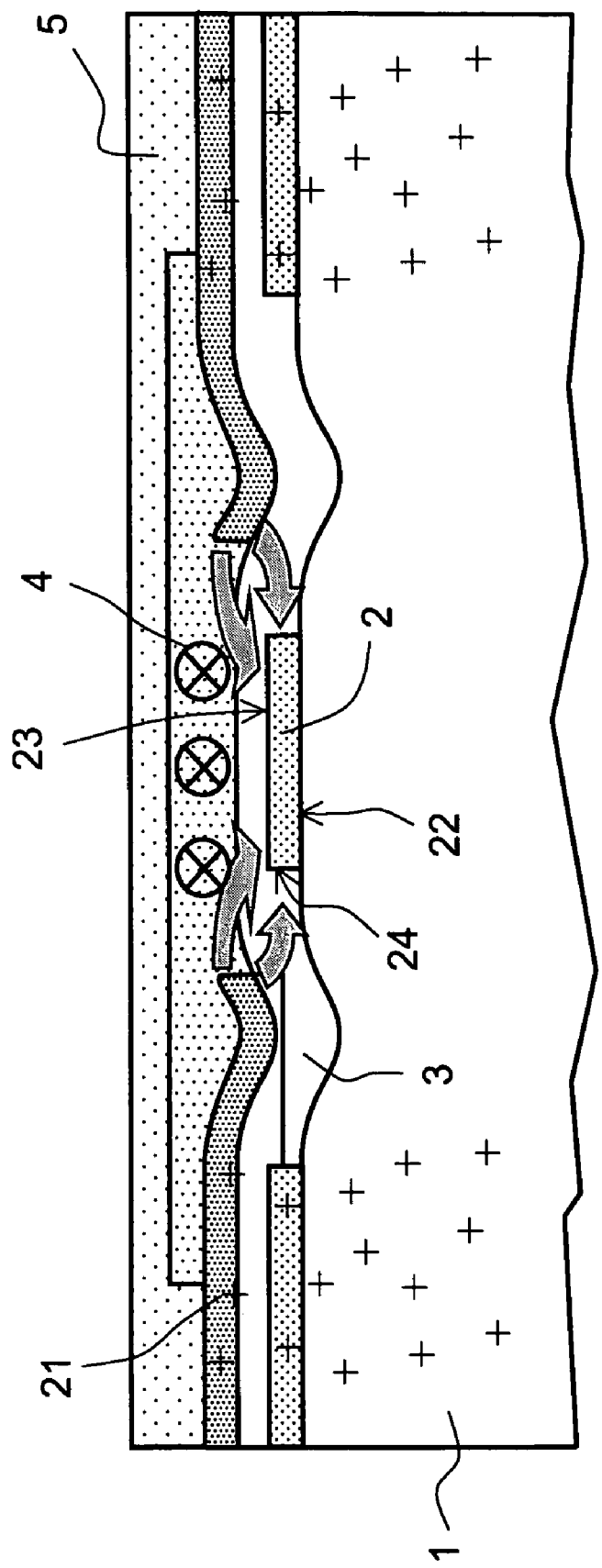
FIG. 5 represents a transverse sectional view of an opto-electronic device comprising an isolator according to the invention.

By way of nonlimiting example, FIG. 5 represents a partial transverse sectional view of an opto-electronic device comprising an isolator with SOA according to the invention. This device is intended to operate in the near infra-red at wavelengths neighbouring 1.3 microns or 1.5 microns.

This isolator comprises successively:

a substrate 1 made of n-doped semi-conductor material which can be made of InP, a stripe-shaped buried active zone 2 comprising a lower face 22 in contact with the substrate, an upper face 23 and two lateral faces 24, the active zone can comprise at least one so-called MQW multiple quantum well structure, its width is of the order of 1 to 2 microns and its thickness a few tenths of a micron.

a p-doped vertical confinement layer 3. This layer covers the whole active zone. Its thickness above the active zone is reduced to a few tenths of a micron. It is also made of InP.

an electrical contact layer 21. As indicated in FIG. 5, this layer is interrupted above the upper surface of the active zone over a width equal to about 1.5 times the width of the active zone. This contact layer is, for example, made of Pt/InGaAs. The injection of the current into the active zone coming from the said contact layer taking place mainly via the lateral faces 24 and the edges of the upper face 23 of the active zone 2 as indicated by the curved solid arrows of FIG. 5.

a magneto-optical material layer 4 which covers, at least, the vertical confinement layer in its part situated above the upper face of the active zone. The material of the magneto-optical layer can be made of Fe/Co alloy. The percentages of iron can be between 10 and 50% and the percentages of cobalt between 50 and 90%. This layer is magnetized as indicated by circles comprising a central cross.

A conducting material layer 5 forming an electrode. This layer is in contact with the electrical contact layer 21. It can be made of gold.

As in the preceding figures, the implantation of protons in the layers is symbolized by the symbols +.

Of course, this structure generally comprises on the same substrate 1 a section comprising an emission source with semi-conductor laser with buried stripe of BRS type comprising at least one active layer and a p-doped vertical confinement layer that are common to those of the SOA amplifying structure, in such a way that the optical isolator ensures the isolation of the said laser. The confinement layer is thicker in the laser section and typically equals 2 to 3 microns. The laser source can be of distributed feedback DFB type and then comprises an optical grating disposed on the active layer.

The method of production of an opto-electronic device comprising at least one amplifying structure of SOA type comprising an optical isolator according to the invention does not pose any particular technological problems and can be carried out conventionally by methods of epitaxial growth followed by etching operations. The deposition of the magneto-optical material can be carried out by spraying.

The method of production comprises at least the following two steps which are:

Step 1: production of the contact layer on the part of the structure corresponding to the optical isolator;

Step 2: removal of the contact layer in the zone of the structure situated above the upper face of the active zone, this step of the method is carried out conventionally by chemical or ion etching.

What is claimed is:

1. An opto-electronic device comprising: an amplifying structure of SOA type having an optical isolator, said structure comprising:

a substrate made of n-doped semi-conductor material;

a stripe-shaped buried active zone having a lower face in contact with the substrate, an upper face and two lateral faces;

a p-doped vertical confinement layer positioned to cover the active zone and the substrate;

an electrical contact layer positioned above the p-doped vertical confinement layer and having a gap spaced above the active zone; and a magneto-optical material layer positioned above the electrical contact layer;

wherein the active zone is configured to receive a current injection from the electrical contact layer only from the two lateral faces and edges of the upper face of the active zone.

2. The opto-electronic device according to claim 1, wherein the gap of the contact layer having a width of about 1.5 times the width of the active zone.

3. The opto-electronic device according to claim 1, further comprising a conducting layer positioned above the magneto-optical material layer.

4. The opto-electronic device according to claim 1, further comprising a section having an emission source with semi-conductor laser with a buried stripe of BRS type, said section having at least one substrate, an active layer and a p-doped vertical confinement layer that are common to those of the amplifying structure, in such a way that the optical isolator ensures the isolation of said laser.

5. The opto-electronic device according to claim 1, wherein the active zone comprises at least one MQW multiple quantum well structure.

6. The opto-electronic device according to claim 1, wherein the thickness of the confinement layer situated above the active zone in the zone of the optical isolator equals about 0.3 microns.

7. The opto-electronic device according to claim 2, wherein the active zone comprises at least one MQW multiple quantum well structure.

8. The opto-electronic device according to claim 3, wherein the active zone comprises at least one MQW multiple quantum well structure.

9. The opto-electronic device according to claim 4, wherein the active zone comprises at least one MQW multiple quantum well structure.

10. The opto-electronic device according to claim 2, wherein the thickness of the confinement layer situated above the active zone in the zone of the optical isolator equals about 0.3 microns.

11. The opto-electronic device according to claim 3, wherein the thickness of the confinement layer situated above the active zone in the zone of the optical isolator equals about 0.3 microns.

12. The opto-electronic device according to claim 4, wherein the thickness of the confinement layer situated above the active zone in the zone of the optical isolator equals about 0.3 microns.

13. The opto-electronic device according to claim 5, wherein the thickness of the confinement layer situated above the active zone in the zone of the optical isolator equals about 0.3 microns.

* * * * *